United States Patent
Stokes et al.

(10) Patent No.: US 6,791,259 B1
(45) Date of Patent: Sep. 14, 2004

(54) SOLID STATE ILLUMINATION SYSTEM CONTAINING A LIGHT EMITTING DIODE, A LIGHT SCATTERING MATERIAL AND A LUMINESCENT MATERIAL

(75) Inventors: Edward Brittain Stokes, Niskayuna, NY (US); Thomas Francis McNulty, Ballston Lake, NY (US); Daniel Darcy Doxsee, Sagamore Hills, OH (US); Alok Mani Srivastava, Niskayuna, NY (US); Lionel Monty Levinson, Schenectady, NY (US); Anil Raj Duggal, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 313 days.

(21) Appl. No.: 09/642,655

(22) Filed: Aug. 22, 2000

Related U.S. Application Data (63) Continuation-in-part of application No. 09/203,206, filed on Nov. 30, 1998, now Pat. No. 6,429,583.

(51) Int. Cl.$^7$ .................................................. H01J 1/62
(52) U.S. Cl. ........................ 313/503; 257/98; 313/116; 313/504
(58) Field of Search ................................ 313/483, 486, 313/512, 503, 504, 116; 257/89, 98; 362/800, 255

(56) References Cited

U.S. PATENT DOCUMENTS

| | | | |
|---|---|---|---|
| 3,760,237 A | * | 9/1973 | Jaffe ........................... 257/100 |
| 5,777,433 A | * | 7/1998 | Lester et al. ................. 313/312 |
| 5,808,409 A | * | 9/1998 | Matsuda et al. ........ 252/301.4 R |
| 5,813,753 A | | 9/1998 | Vriens et al. ................ 362/293 |
| 5,847,507 A | * | 12/1998 | Butterworth et al. .......... 257/89 |
| 6,066,861 A | | 5/2000 | Höhn et al. .................... 257/99 |
| 6,069,440 A | | 5/2000 | Shimizu et al. .............. 313/486 |
| 6,084,250 A | | 7/2000 | Jüstel et al. | 
| 6,096,496 A | * | 8/2000 | Frankel ........................... 435/4 |
| 6,245,259 B1 | * | 6/2001 | Hohn et al. ............. 252/301.36 |
| 6,294,800 B1 | * | 9/2001 | Duggal et al. ................. 257/89 |
| 6,357,889 B1 | * | 3/2002 | Duggal et al. .............. 313/512 |
| 6,576,930 B2 | | 6/2003 | Reeh et al. | 
| 2002/0084745 A1 | * | 7/2002 | Wang et al. ................. 313/498 |

FOREIGN PATENT DOCUMENTS

| | | |
|---|---|---|
| JP | 183408 | 6/2000 |
| WO | WO 00/32982 | 6/2000 |
| WO | WO 00/33389 | 6/2000 |
| WO | WO 00/33390 | 6/2000 |

OTHER PUBLICATIONS

Reeh et al. Light–Emitting Semiconducto Component with Luminescence Conversion Element, Dec. 31, 1997 WO 97/50132, all.*
"DuPont Ti–Pure Titanium Dioxide Web Page," DuPont Home Page, visited Aug. 3, 2000.
S. Nakamura et al.: The Blue Laser Diode, pp. 216–221, 328–329 (1997) (Sep.).

* cited by examiner

Primary Examiner—Vip Patel
Assistant Examiner—Glenn Zimmerman
(74) Attorney, Agent, or Firm—Foley & Lardner LLP (57) ABSTRACT

A lamp containing a radiation source, a luminescent material and a radiation scattering material located between the radiation source and the luminescent material is provided. The lamp may be a white emitting lamp. The radiation source may be a blue emitting LED. The luminescent material may be a yellow emitting phosphor or dye. The radiation scattering material may be ceramic particles, such as TiO$_2$ particles, in a carrier medium, such as glass, epoxy or silicone.

39 Claims, 3 Drawing Sheets

SOLID STATE ILLUMINATION SYSTEM CONTAINING A LIGHT EMITTING DIODE, A LIGHT SCATTERING MATERIAL AND A LUMINESCENT MATERIAL

This application is a continuation-in-part of Application U.S. Ser. No. 09/203,206, filed Nov. 30 1998, now U.S. Pat. No. 6,429,583, incorporated by reference herein in its entirety.

BACKGROUND OF THE INVENTION

This invention relates generally to a white light illumination system, and specifically to a solid state lamp containing a semiconductor light emitting diode ("LED") or laser diode, a light scattering material, and a luminescent phosphor or dye material.

Light emitting diodes are semiconductor chips that are mounted in a package and emit radiation in response to an applied voltage or current. These LEDs are used in a number of commercial applications such as automotive, display, safety/emergency and directed area lighting. Recently, a white light emitting lamp was developed which includes a blue light emitting diode and a yellow emitting phosphor As discussed in chapter 10.4 of "The Blue Laser Diode" by S. Nakamura et al., pages 216–221 (Springer 1997), incorporated herein by reference, white light LEDs are fabricated by forming a ceramic phosphor layer on the output surface of a blue light emitting semiconductor LED. Conventionally, the blue LED is an InGaN single quantum well LED and the phosphor is a cerium doped yttrium aluminum garnet ("YAG:Ce"), $Y_3Al_5O_{12}:Ce^{3+}$. The blue light emitted by the LED excites the phosphor, causing it to emit yellow light. The blue light emitted by the LED is transmitted through the phosphor and is mixed with the yellow light emitted by the phosphor. The viewer perceives the mixture of blue and yellow light as white light. However, these white LED lamps suffer from the undesirable halo effect and the penumbra effect.

The halo effect occurs due to the separation of blue and yellow light. The LED emits blue light in a directional, anisotropic fashion. However, the phosphor emits yellow light isotropically (i.e., in all directions). Therefore, when the light output by the system is viewed straight on (i.e., along the LED emission direction), the light appears bluish-white. In contrast, when the light output is viewed at an angle to the LED emission direction, the light appears yellowish due to the predominance of the yellow phosphor emission. When the light output by such a system is directed onto a flat surface, it appears as a yellowish halo surrounding a bluish area.

The penumbra effect is similar to the halo effect, except that the halo effect is a color separation effect, while the penumbra effect is a non-uniform intensity effect. The penumbra effect causes the white LED lamp emission to appear brighter at the center than at the edges. As noted above, the LED emission is directional, while the phosphor emission is isotropic. Therefore, the white light emitted by the lamp appears brighter at the center, where the LED light is directly visible and where the LED light directly excites the phosphor. In contrast, the less bright edge of the white light emission is due to the stray and/or reflected LED light and the phosphor emission excited by such LED light. The halo and/or penumbra effects cause the white LED lamps to fail to meet applicable commercial quality standards required for illumination devices.

Figure 1:
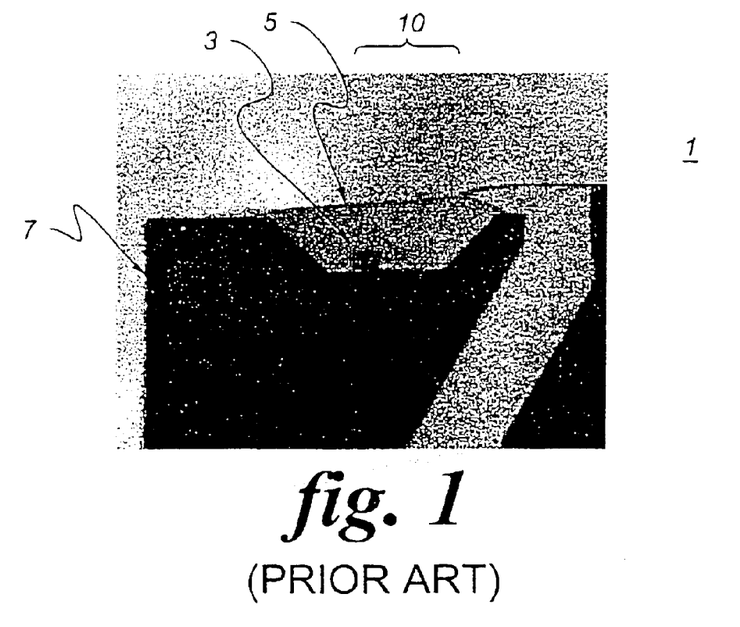
FIGS. 1, 3 and 4 are side cross sectional views of prior art white LED lamps.
Figure 2:
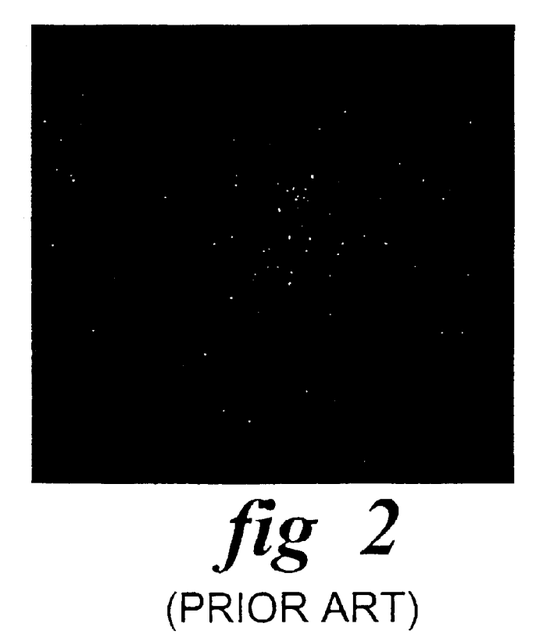
FIG. 2 is a plan view of the emission of the lamp of FIG. 1.

FIGS. 1 and 2 illustrate the halo effect and the penumbra effect. In FIG. 1, the white LED lamp 1 contains a blue emitting LED chip 3, a thick phosphor containing silicone layer 5 over the LED chip 3, and a reflector cup package 7 supporting the LED chip 3. The blue emission from the LED chip 3 is transmitted through the phosphor containing layer 5, and is mixed with the yellow emission from the phosphor in layer 5, which together appear as white light 10 to an observer. FIG. 2 shows a plan view of the lamp 1 emission. As can be seen in FIG. 2, the lamp 1 emission appears bluish in the center, and yellowish around the periphery thus illustrating the halo effect. Furthermore, the lamp 1 emission appears brighter at the center than at the periphery, thus illustrating the penumbra effect.

Figure 3:
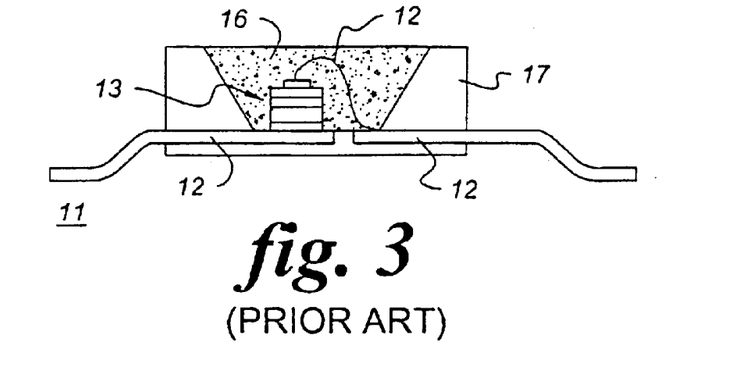

One conventional approach to decrease the halo effect is to incorporate a light scattering or diffusing material into the lamp. For example, U.S. Pat. No. 6,066,861, incorporated herein by reference, describes a white light emitting lamp 11 where the light scattering or diffusing particles 16 are incorporated into the same epoxy encapsulating material 15, which contains the YAG:$Ce^{3+}$ phosphor. The epoxy 15 is located over the blue LED 13, as illustrated in FIG. 3. The LED chip 13 contains lead and wire electrodes 12 and a reflector cup package 17.

Figure 4:
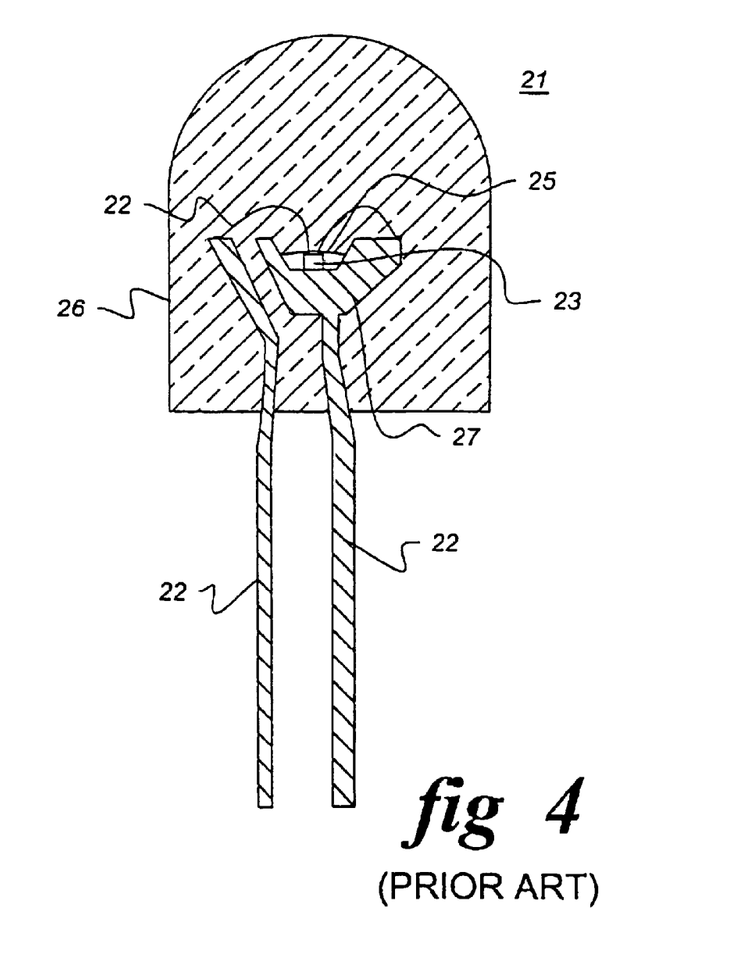

Alternatively, U.S. Pat. No. 6,069,440, incorporated herein by reference, discloses placing the light scattering material above the phosphor material, as illustrated in FIG. 4. In FIG. 4, the white light emitting lamp 21 contains a blue LED 23 located in a reflector cup 27 portion of one of the lead electrodes 22. The LED chip 23 is connected to wire and lead electrodes 22. An epoxy material 25 containing the YAG:$Ce^{3+}$ phosphor is located directly above the blue LED 23. The light scattering or diffusing particles are incorporated into a molding layer 26 above the phosphor containing epoxy 25.

Therefore, in both of the above conventional lamps 11, 21, the light scattering material is positioned above or at the same level as the phosphor. The light scattering material scatters both the blue light transmitted through the phosphor and the yellow light emitted by the phosphor.

The present inventors have determined that, in the prior art LED lamp 11 of FIG. 3, the penumbra effect has its origins in the dissimilarity of the spatial extent and degree of collimation of the yellow and blue sources of light. The blue source is the LED (or laser diode) chip itself, and the light emitted from the chip is at least partially collimated by waveguide effects, especially in the lateral direction. The yellow source is the ensemble of phosphor particles, each of which emits yellow light in a random direction at intensity directly proportional to the intensity of blue "pumping" light at the spatial position of the particle. To further complicate the situation, both blue and yellow light rays are elastically scattered by the phosphor particles. Finally, the amount of yellow light emitted by a given phosphor particle depends on its blue absorbance, which depends on its shape and size.

An ideal phosphor coating would contain a high concentration of phosphor particles in regions of high blue light intensity, and a lower concentration of phosphor particles in regions of lower blue light intensity, such that the spectrum of light emitted from rays in any direction and from any two points on the periphery of the lamp differ by only a scaling constant. In practice, however, this is difficult to implement when the blue and yellow source geometries are so dissimilar. The present invention is directed to overcoming or at least reducing the problems set forth above.

BRIEF SUMMARY OF THE INVENTION

In accordance with one aspect of the present invention, there is provided a light emitting device, comprising a radiation source, a luminescent material, and a radiation scattering material located between the radiation source and the luminescent material.

In accordance with another aspect of the present invention, there is provided a white light emitting device, comprising a package containing a reflector cup, a light emitting diode in the reflector cup, radiation scattering particles in a packed layer or in carrier medium over the light emitting diode, and a phosphor or an organic dye which emits radiation having a second peak wavelength in response to incident light emitting diode radiation having a first peak wavelength, such that the device output appears white to an observer.

In accordance with another aspect of the present invention, there is provided a method of generating white light comprising supplying power to a light emitting diode, generating a directional blue light or ultraviolet radiation, passing the blue light or ultraviolet radiation through a light or radiation scattering material to diffuse the blue light or ultraviolet radiation in a plurality of directions providing the diffuse blue light or ultraviolet radiation onto a luminescent material, and generating white light.

In accordance with another aspect of the present invention, there is provided a light emitting device, comprising a radiation source, a discrete luminescent material layer which exhibits substantially no Mie scattering, and a discrete radiation scattering phosphor layer located between the radiation source and the luminescent material, which exhibits Mie scattering.

DETAILED DESCRIPTION OF THE INVENTION

In view of the problems in the prior art, it is desirable to obtain a white solid state lamp with decreased halo and penumbra effects. The present inventors have realized that one of the causes of the halo effect is that due to the directional nature of the blue LED emission, a non-uniform source of blue light is incident on the phosphor layer. In contrast, in fluorescent lamps, a uniform source of UV energy is incident on the phosphor, which emits a fairly uniform white light. Therefore, in order to obtain a significant decrease in the halo and/or penumbra effects, the radiation scattering material is placed between the radiation source, such as an LED or a laser diode, and the luminescent material, such as a phosphor or a dye. The term "radiation" includes UV radiation as well as visible light, such as blue light. When the radiation scattering material is placed between the radiation source and the luminescent material, the radiation source radiation being scattered isotropically, is made substantially uniform and diffuse prior to being incident on the phosphor, similar to the uniform UV radiation source in the fluorescent lamp. Thus, the lamp emits white light with high far field color and intensity uniformity.

Therefore, one purpose of the scattering layer between the radiation source, such as the LED or a laser diode, and the luminescent material, such as a phosphor, is to make the blue light source appear more similar to the yellow light source. Thus, the blue light source effectively loses the memory of the LED or laser diode chip geometry, and the resulting collimation, by virtue of having been scattered by the scattering layer. If the radiation source is a higher intensity laser diode, then the scattering layer serves the additional purpose of lowering the intensity of the radiation incident on the phosphor, so as not to allow the intense, highly collimated and coherent laser radiation to damage the phosphor layer.

Figure 5:
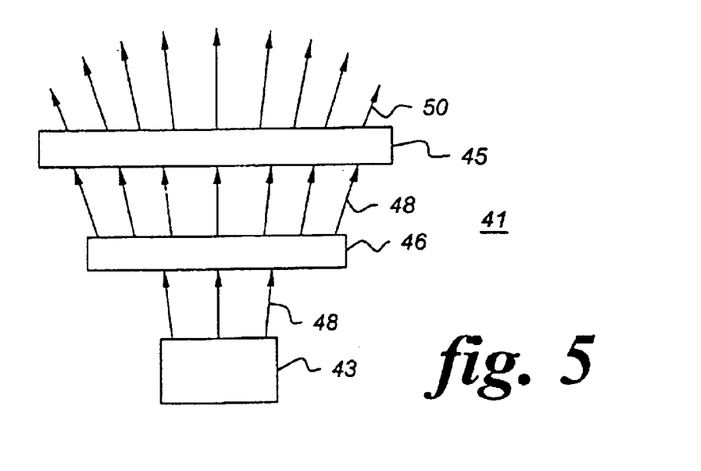
FIG. 5 is a schematic illustration of the method of operation of a white LED lamp according to the preferred embodiment of the present invention.

FIG. 5 illustrates a method of generating white light using the solid state lamp 41 according to one preferred embodiment of the present invention. First, a power is supplied to a radiation source 43, such as an LED or laser diode. The LED or laser diode generates a directional blue light or ultraviolet radiation 48. The blue light or UV radiation 48 passes through a light or radiation scattering material 46 to diffuse the blue light or ultraviolet radiation 48 in a plurality of directions, as illustrated in FIG. 5. The diffuse or scattered blue light or ultraviolet radiation 48 is provided onto the entire luminescent material 45, such as a phosphor or an organic dye, in an isotropic fashion. The luminescent material 45 comprises a separate layer of material from the scattering material 46 layer. The lamp 41 thus generates white light 50 having a substantially uniform color and intensity. A white emitting lamp 41 is preferred for some applications. However, the emission wavelength of the radiation source 43 and the luminescent material 45 may be selected to emit light other than white light 50, such as blue, green, yellow, orange, red light, or a combination color light.

The lamp 41 may generate white light in at least two different ways. In a first way, the LED or laser diode 43 emits blue light 48 having a wavelength between about 420 and 480 nm. The blue light 48 is passed through the light scattering material 46 and is diffused in a plurality of directions. The diffuse, isotropic blue light is then incident on a phosphor containing layer 45 which isotropically emits yellow light in response to being irradiated with blue light 48. The observer perceives the combination of the diffuse, isotropic blue light 48 transmitted through the phosphor containing layer 45 and the isotropic yellow light as white light 50 having a substantially uniform color and intensity.

In a second way of generating white light 50, the LED or laser diode 43 emits radiation to which the human eye is not sensitive. For example, the LED or laser diode emits radiation 48 having a peak wavelength less than 420 nm, such as between 365 and 420 nm, preferably between 390 and 410 nm, most preferably, ultraviolet radiation having a wavelength below 410 nm, such as 405 nm. The radiation 48 is passed through an appropriate radiation scattering material 46 and is diffused in a plurality of directions. The diffuse, isotropic radiation is then incident on a layer 45 containing one or more phosphors and/or dyes, which isotropically emits white light 50 in response to being irradiated with radiation 48. Since the human eye is not sensitive to radiation 48, even if it is transmitted through layer 45, the human observer will only see the isotropic, uniform white light 50 emitted by layer 45.

It should be noted that a white light emitting lamp containing the UV emitting LED or laser diode does not suffer from the halo effect even without the radiation scattering layer 46, because the white light 50 is isotropically emitted by the luminescent material 45 and the white light 50 does not contain a visible anisotropic LED or laser diode emission component. However, such a lamp may suffer from the penumbra effect, due to the higher excitation intensity of the middle than the periphery of the phosphor or dye layer 45 by the directional UV LED or laser diode 43 emission. However, the addition of the radiation scattering layer 46 reduces or even eliminates the penumbra effect, as described above.

The radiation source 43 may be any blue or UV radiation source having a first peak emission wavelength, $\lambda_1$. Preferably, the radiation source 43 is an LED or a semiconductor laser diode which emits blue light or UV radiation 48. Most preferably, the radiation source is a semiconductor LED. The LED 43 may comprise a semiconductor diode based on any suitable III-V, II-VI, IV or IV-IV semiconductor. For example, the LED may contain at least one semiconductor layer based on GaN, ZnSe, Si (such as porous silicon) or SiC semiconductors. The LED may also contain one or more quantum wells in the active region, if desired. Preferably, the LED active region comprises a p-n junction comprising GaN, AlGaN and/or InGaN semiconductor layers. The p-n junction may be separated by a thin undoped InGaN layer or by one or more InGaN quantum wells. Furthermore, the LED 43 may be a directional emission LED, such as a resonant cavity LED.

The luminescent material 45 may be any material which emits a second peak emission wavelength, $\lambda_2$, in response to the radiation source radiation, where $\lambda_2 > \lambda_1$. The luminescent material 45 may be a phosphor, a blend of plural phosphors or an organic dye. For example, for a blue emitting LED (or laser diode) 43, the luminescent material 45 preferably comprises a yellow emitting phosphor, such as a cerium doped yttrium aluminum garnet (YAG: $Ce^{3+}$ or $Y_3Al_5O_{12}:Ce^{3+}$) or manganese doped zinc sulfide ($ZnS:Mn^{2+}$). It should be noted that these some of the constituents of these phosphors may be substituted in part of in whole with other elements, such as Gd for Y or Ga for Al in YAG:$Ce^{3+}$ and Cd for Zn in ZnS:$Mn^{2+}$, for example.

Alternatively, the luminescent material 45 may be an organic dye which emits a longer wavelength of light $\lambda_2$ in response to incident shorter wavelength, $\lambda_1$, LED light 48. Preferably, the dye comprises a yellow emitting dye, such as Fluorol 7GA or Rhodamine 110, and the LED light 48 comprises blue light, such that the combined output appears white. Alternatively, other colored dyes, such as Coumarin 6, DOCI, DCM, DCM special, Pyridine 1 or Pyridine 2 may be used instead. These dyes are available from Lambda Physik, Inc. of Fort Lauderdale, Fla.

For a UV radiation emitting LED (or laser diode) 43, the luminescent material 45 may be any phosphor or dye which emits white light 50 in response to incident UV LED radiation 48. For example, the luminescent material 45 is preferably a blend of blue and orange emitting phosphors. The blue emitting phosphor may comprise a $Sr_4Al_{14}O_{25}:Eu^{2+}$ (SAE) phosphor. The orange emitting phosphor may comprise a europium and manganese doped alkaline earth pyrophosphate phosphor, $A_2P_2O_7:Eu^{2+},Mn^{2+}$, where A comprises at least one of Sr, Ca, Ba or Mg. Preferably, A comprises strontium. It should be noted that some of the constituents of these phosphors may be substituted in part of in whole with other elements, if desired. Alternatively, other phosphors or phosphor blends may be used. For example, a tri-phosphor blend of a red emitting $Y_2O_3:Eu^{3+}, Bi^{3+}$ phosphor, a green emitting $Ca_8, Mg(SiO_4)Cl_2:Eu^{2+}, Mn^{2+}$ phosphor, and a blue emitting SECA ((Sr, Ba,Ca)$_5$(PO$_4$)$_3$Cl:Eu$^{2+}$) or BAM (BaMg$_2$Al$_{16}$O$_{22}$:Eu$^{2+}$) phosphors may be used instead. Alternatively, the luminescent material 45 may be an organic dye which emits white light 50 in response to incident UV LED radiation 48, such as tri-dye blend of red, green and blue dyes.

Preferably, the luminescent material 45 comprises a packed phosphor particle layer or a dispersion of phosphor particles in a polymer encapsulating material. The encapsulating material may comprise epoxy or silicone. For example, the luminescent material may comprise a dispersion of an epoxy and a YAG:$Ce^{3+}$ phosphor. The phosphor may have a mean ($d_{50}$) particle size of 1 to 25 microns, preferably 5–10 microns. By placing material 46 between the phosphor 45 and the LED 43, the phosphor 45 will remain cooler than if the phosphor 45 was in direct contact with the heat emitting LED 43. This configuration is advantageous because it reduces or eliminates the reversible thermal quantum efficiency degradation of the phosphor 45 during the operation of the lamp 41.

The radiation scattering material 46 may be any material that is suitable for scattering or isotropically diffusing the radiation 48, such as blue light or UV radiation emitted by the radiation source 43. Preferably, the radiation scattering material comprises radiation scattering particles in a carrier medium or a layer of closely packed radiation scattering particles.

In a preferred embodiment, the radiation scattering particles may comprise any particles which substantially reflect or scatter rather than absorb blue or UV radiation. The carrier medium may comprise any material that has a different index of refraction than the radiation scattering particles and which substantially does not scatter or absorb visible light (i.e., a transparent material or a transmissive body).

Most preferably, the radiation scattering particles comprise ceramic or other insulating particles dispersed in the carrier medium selected from glass, such as $SiO_2$, or a plastic material or a polymer, such as epoxy, silicone or urea resin. The particles may be selected from a group consisting of $TiO_2$, $BaTiO_3$, $Al_2O_3$, $SiO_2$, $CaCO_3$, $BaSO_4$ and diamond. However, material 46 may comprise a continuous layer rather than packed particles or a particle dispersion or blend.

Alternatively, the light scattering particles may be substituted with intentionally introduced air or gas bubbles in the carrier medium. For example, there may be at least twice as many intentionally introduced air bubbles in an epoxy or silicone layer as there would be inherently contained in the same epoxy or silicone layer where no special effort was made to introduce the air bubbles. However, in another aspect of the present invention, the light scattering material comprises solid particles rather than air bubbles.

The light scattering particles may have a mean diameter ($d_{50}$) of 50 to 500 nm. Preferably, the mean particle diameter is between $\lambda/3$ and $\lambda/2$, where $\lambda$ is the peak emission wavelength of the radiation source 43, such as an LED. The light scattering particles scatter light most efficiently when their diameter is between $\lambda/3$ and $\lambda/2$. Thus, the preferred mean particle diameter is 100 to 300 nm, most preferably, between 140 and 240 nm, for typical blue or UV peak emission wavelengths. For example, for blue emitting LEDs having a peak emission wavelength of $\lambda=450$ nm, the particle size is preferably 150 to 225 nm, while for a peak emission wavelength of $\lambda=480$ nm, the particle size is preferably 160 to 240 nm. For UV emitting LEDs having a peak emission wavelength of $\lambda=390$ nm, the particle size is preferably 130 to 190 nm.

Figure 6:
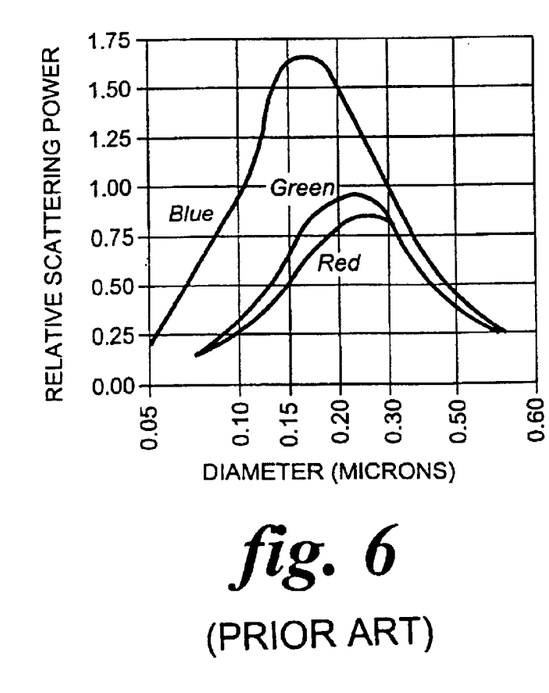
FIG. 6 is a graph of relative light scattering power versus particle diameter.

In one preferred embodiment, the radiation scattering particles have a size such that the particles preferentially scatter blue or UV LED light as compared to yellow, green, red or white light from the luminescent material. Preferably, the particle size is selected such that the particles scatter at least 50% more radiation source radiation than luminescent material radiation. FIG. 6 illustrates the relationship between the particle diameter and the wavelength of the scattered light for Ti-Pure® rutile $TiO_2$ particles made by DuPont. As illustrated in FIG. 6, the relative scattering power of 100 to 200 nm $TiO_2$ particles is above 1 for blue incident radiation, while it is below 1 for green and red incident radiation. Therefore, as illustrated in FIG. 6, 100 to 200 nm particles have at least a 50% greater scattering power for blue radiation (i.e., such as that emitted by a blue emitting LED) than green or red (or for that matter yellow) radiation (i.e., such as that emitted by the phosphor or dye). This particle size range is advantageous because it enhances the scattering of the radiation source radiation while it decreases the amount of scattering of the luminescent material radiation. Therefore, the lamp radiation output is rendered more uniform because a greater amount of radiation source radiation is scattered toward the luminescent material, while a lesser amount of the luminescent material radiation that is emitted downward toward the radiation source is scattered back toward the luminescent material.

Figure 7:
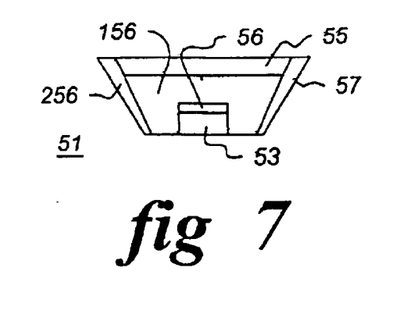
FIG. 7 is a schematic side cross sectional view of a white LED lamp according to the preferred embodiment of the present invention.

FIG. 7 schematically illustrates a structure of a white LED lamp 51 according to a preferred embodiment the present invention. The lamp 51 contains a package 57 supporting the LED chip 53. The package 57 may comprise a plastic chip carrier containing a reflector cup cavity, as illustrated in FIG. 3 or a reflector cup portion of one of the lead electrodes, as illustrated in FIG. 4. However, a reflector cup is not required, and the LED chip may be directly mounted on a lead or a flat chip carrier. Furthermore, the package 57 may comprise an array of a plurality of light emitting diode chips 53. The LED chip 53 may be electrically connected to leads using one or two bonding wires or the chip 53 may be packaged in a flip-chip configuration with both LED electrodes contacting the respective leads without using bonding wires.

Lamp 51 also contains at least one radiation scattering material located above the LED chip 53 and a luminescent material 55 located above the radiation scattering material, as illustrated in FIG. 7. The radiation scattering material may comprise a layer 56 of the LED chip 53 or an encapsulation layer 156 overlying the LED chip 53. Furthermore, if the LED chip 53 is located in a reflector cup, then the radiation scattering material may further comprise a layer 256 on the sidewalls of the cup. Thus, the radiation scattering material preferably comprises layer 56 or layer 156 and layer 256. Most preferably, the radiation scattering material comprises all three of layers 56, 156 and 256.

In a first preferred embodiment of the present invention, layer 56 may comprise at least one light or UV radiation scattering particle layer in a glass passivation layer 56 layer on the LED chip 53. The glass passivation layer 56 may be about 0.25 to about 0.75 microns, preferably about 0.5 micron thick vacuum deposited or spin-on $SiO_2$ layer over the top of the LED chip 53. The scattering particles may comprise about 50 to about 500 nm, preferably 120 to 200 nm, $TiO_2$ particles dispersed in the $SiO_2$ layer 56. However, other glass and particle materials may be used if desired. Layer 56 may be deposited over the top semiconductor or electrode layer of a top emitting LED, and over the transparent substrate of a substrate emitting LED, such as a lateral current injection LED mounted in a flip-chip configuration (i.e., with the substrate toward the light emitting surface of the package). Alternatively, layer 56 may comprise a layer of closely packed radiation scattering particles.

Alternatively, a relatively thick glass layer 56 may be used containing a plurality of scattering particle layers. For example, an about 1 to about 2 micron thick layer 56 may contain two to five layers of light scattering particles to achieve photonic crystal effects. The particles arranged to achieve the photonic crystal effects absorb radiation in a certain wavelength band but transmit radiation in another wavelength band. For example, the photonic crystal effects may be used to absorb UV radiation but transmit visible light. The relatively thick layer of glass 56 is advantageously placed in contact with the bonding wires because the $TiO_2$ particles increase the thermal conductivity of the glass, thus increasing the thermal extraction from the LED chip 53.

In a second preferred embodiment of the present invention, the encapsulation layer 156 may comprise light or UV radiation scattering particles in a polymer layer over the LED chip 53 or over and on the sides of the LED chip 53, as illustrated in FIG. 7. Preferably, layer 156 comprises a silicone layer containing a dispersion of 5–10% amorphous silica particles having a mean diameter of 120 to 200 nm, such as silicone rubber compound TSE399-C, made by GE and Toshiba, placed in contact with the top and sides of the LED chip 53. Alternatively, the carrier medium of layer 156 may comprise epoxy or other resins. However, silicone is the preferred carrier medium because it does not darken as much as epoxy upon exposure to LED's UV or blue radiation. The refractive index and thermal conductivity of the organic encapsulation/inorganic scattering particle dispersion may be optimized to advantageously achieve the desired heat and light extraction.

In a third preferred embodiment of the present invention, radiation scattering material may further comprise a layer 256 on the sidewalls and/or on the bottom of the LED package 57, such as on the sidewalls and/or bottom of the reflector cup. The light scattering layer 256 may comprise a $MgF_2$ or a polymer layer, such as a Spectralon® layer made by DuPont.

In a fourth preferred embodiment of the present invention, the radiation scattering material does not luminesce and the luminescent material does not substantially scatter light or UV radiation. The combination of a radiation scattering material that does not luminesce and luminescent material that does not substantially scatter light or UV radiation is advantageous because it allows more precise, easier modeling of the LED/scattering material/luminescent material system. In a system where radiation scattering material luminesces and/or the luminescent material scatters radiation, the modeling of the intensity and color of light is very complicated and rather imprecise.

Generally, there are two types of scattering. The first type is Rayleigh scattering, which tends to be a very weak scattering by particles with a mean diameter smaller than about $\lambda/10$. For incident blue light having a wavelength between 420 and 470 nm, particles with a mean diameter smaller than about 50nm would exhibit Rayleigh scattering. Thus, nanocrystalline phosphors, such as $ZnS:Mn^{2+}$ having a mean particle diameter of less than 20 nm, or organic dye molecules exhibit Rayleigh scattering, and thus substantially do not scatter the incident radiation having a peak wavelength of $\lambda$. The second type of scattering is Mie scattering. This type of scattering tends to be strong scattering. Mie scattering is biased in the forward direction, and is exhibited by particles with diameter larger than $\lambda/10$ (i.e., larger than about 50 nm for incident blue light).

Particles having a mean diameter larger than about 2.5λ exhibit extinction and reflection rather than scattering. Prior art YAG:Ce$^{3+}$ phosphors used with blue LEDs have a mean particle diameter of 1 to 20 microns, and thus also do not significantly scatter blue light.

In a preferred aspect of the fourth preferred embodiment, the luminescent material comprises a nanocrystalline phosphor or an organic dye that exhibits only Rayleigh scattering and thus substantially does not scatter the incident radiation. Inorganic phosphors scatter light due to their particle size being on the order of the wavelength of light, whereas organic dyes (such as Fluorol 7GA or Rhodamine 110) are molecular in form and therefore much smaller than the wavelength of light and hence do not substantially scatter light. Likewise, nanocrystalline phosphors, such as manganese doped zinc sulfide (ZnS:Mn$^{2+}$) substantially do not scatter light because the phosphor particle size (i.e., a mean particle diameter of less than λ/10, preferably less than 20 nm) is also much smaller than the wavelength of light. The radiation scattering particles that do not luminesce may be ceramic or other insulating particles, such as TiO$_2$, BaTiO$_3$, Al$_2$O$_3$, SiO$_2$, CaCO$_3$, BaSO$_4$ and diamond.

In a fifth preferred embodiment of the present invention, the radiation scattering material 46 luminesces in addition to scattering or diffusing the radiation 48 emitted by the radiation source 43. This embodiment is advantageous because any absorption of the radiation source photon of a first wavelength results in an emission of a photon having a second wavelength, rather than a total loss of the first photon. Thus, the lamp 41 intensity is improved.

In a preferred aspect of the fifth embodiment, the radiation scattering material comprises a phosphor having a particle size similar to the emission wavelength of the radiation source. For example, the mean phosphor particle diameter is 50 to 500 nm, most preferably 140 to 240 nm. Preferably the mean diameter of the radiation scattering phosphor particles is between λ/3 and λ/2, where λ is the peak emission wavelength of the radiation source, and the phosphor exhibits Mie scattering of the radiation source radiation (while the particle distribution has a particular mean diameter, it is possible that some particles may have a size that is so different from the mean diameter so as not to exhibit Mie scattering).

Thus, the lamp 41, 51 illustrated in FIGS. 5 and 7 may contain the following components. A blue light emitting diode or laser diode 53 as the radiation source 43, having a peak emission wavelength between 420 and 480 nm. A first yellow emitting phosphor 46, 56 or 156, such as YAG:Ce$^{3+}$ or ZnS:Mn$^{2+}$, having a mean particle diameter of 140 to 240 nm, that scatters the blue light emitted by the LED, is located above the LED 53. Another second yellow emitting phosphor 45, 55, such as YAG:Ce$^{3+}$ or ZnS:Mn$^{2+}$, having a mean particle diameter of 1 to 10 microns that substantially does not scatter the blue light emitted by the LED, is located above the first phosphor layer 46, 56 or 156 (while the particle distribution has a particular mean diameter, it is possible that some particles may have a size that is so different from the mean diameter so as to exhibit Mie scattering). Furthermore, while yellow emitting, radiation scattering first phosphor layers 46, 56, 156 have been described above, the phosphor layers 46, 56, 156, may comprise phosphors that emit colors other than yellow. The first and second phosphor layers may be packed particle layers or dispersions of particles in a carrier medium, such as epoxy or silicone. Therefore, the first and second phosphor layers comprise discrete layers, where the particle size of the first phosphor layer 46, 56, 156 is smaller than that of the second phosphor layer 45, 55, such that the first phosphor layer exhibits Mie scattering of the radiation source 43, 53 radiation and the second phosphor layer does not.

The preferred embodiments have been set forth herein for the purpose of illustration. However, this description should not be deemed to be a limitation on the scope of the invention. Accordingly, various modifications, adaptations, and alternatives may occur to one skilled in the art without departing from the spirit and scope of the claimed inventive concept.

We claim:

1. A light emitting device, comprising:
   a radiation source;
   a luminescent material; and
   a radiation scattering material located between the radiation source and the luminescent material;
   wherein:
   the radiation scattering material comprises radiation scattering particles located separately from the luminescent material;
   a mean diameter of the radiation scattering particles is between λ/3 and λ/2, where λ is a first peak emission wavelength of the radiation source;
   the radiation source comprises a light emitting diode or a laser diode emitting radiation having the first peak emission wavelength; and
   the luminescent material comprises a phosphor which emits radiation having a second peak wavelength in response to incident radiation source radiation.

2. The device of claim 1, wherein:
   the radiation source comprises a blue or ultraviolet light emitting diode or laser diode; and
   the luminescent material comprises a phosphor layer or a dispersion of phosphor in a transmissive encapsulating material.

3. The device of claim 1, wherein:
   the radiation source comprises a blue light emitting diode; and
   the luminescent material comprises a yellow light emitting phosphor layer or a dispersion of a yellow light emitting phosphor in a polymer material.

4. The device of claim 3, wherein the light emitting diode comprises a blue emitting InGaN light emitting diode and the luminescent material comprises a dispersion of an epoxy or silicone and a YAG:Ce$^{3+}$ phosphor.

5. The device of claim 2, wherein the radiation source comprises an ultraviolet light emitting diode and the luminescent material emits white light in response to the ultraviolet radiation emitted by the light emitting diode.

6. A light emitting device, comprising:
   a radiation source;
   a luminescent material; and
   a radiation scattering material located between the radiation source and the luminescent material;
   wherein:
   the radiation scattering material comprises radiation scattering particles in a packed layer located separately from the luminescent material;
   the radiation source comprises a light emitting diode or a laser diode emitting radiation having a first peak emission wavelength; and
   the luminescent material comprises an organic dye which emits radiation having a second peak wavelength in response to incident radiation source radiation.

7. The device of claim 1, wherein the radiation scattering material comprises a layer of packed radiation scattering particles.

8. The device of claim 1, wherein the radiation scattering material comprises radiation scattering particles in a carrier medium comprising a transmissive body.

9. The device of claim 8, wherein:
the radiation scattering particles comprise particles selected from a group consisting of $TiO_2$ and $Al_2O_3$; and the carrier medium is selected from glass, silicone and plastic material.

10. The device of claim 8, wherein:
the radiation scattering particles comprise 140 to 240 nm particles selected from a group consisting of $TiO_2$, $BaTiO_3$, $Al_2O_3$, $SiO_2$, $CaCO_3$, $BaSO_4$, and diamond; and
the carrier medium is selected from glass, epoxy, silicone and urea resin.

11. The device of claim 8, further comprising:
a package supporting the radiation source comprising a light emitting diode; and
wherein the radiation scattering particles in the carrier medium are located above the light emitting diode and the luminescent material is located above the radiation scattering particles in the carrier medium.

12. The device of claim 11, wherein the radiation scattering particles in a carrier medium comprise at least one of the following:
a) at least one light or UV radiation scattering particle layer in a glass passivation layer directly over the light emitting diode; and
b) light or UV radiation scattering particles in a silicone layer over the light emitting diode or over and on sides of the light emitting diode.

13. A light emitting device, comprising:
a radiation source;
a luminescent material;
a radiation scattering material located between the radiation source and the luminescent material; and
a package supporting the radiation source;
wherein:
the radiation scattering material comprises radiation scattering particles located separately from the luminescent material;
the radiation source comprises a light emitting diode emitting radiation having a first peak emission wavelength;
the luminescent material comprises a phosphor which emits radiation having a second peak wavelength in response to incident radiation source radiation;
the radiation scattering material comprises the radiation scattering particles located in a carrier medium comprising a transmissive body and a light or UV radiation scattering particle layer located on sidewalls of a reflector cup portion of the package containing the light emitting diode; and
the radiation scattering particles in the carrier medium are located above the light emitting diode and the luminescent material is located above the radiation scattering particles in the carrier medium.

14. The device of claim 13, wherein the radiation scattering material comprises all three of:
a) at least one light or UV radiation scattering particle layer in a glass passivation layer directly over the light emitting diode;
b) light or UV radiation scattering particles in a silicone layer over the light emitting diode or over and on sides of the light emitting diode; and
c) the light or UV radiation scattering particle layer on the sidewalls of the reflector cup portion of the package containing the light emitting diode.

15. A light emitting device, comprising:
a radiation source;
a luminescent material; and
a radiation scattering material located between the radiation source and the luminescent material;
wherein:
the radiation scattering material comprises radiation scattering particles located separately from the luminescent material;
the radiation source comprises a light emitting diode or a laser diode emitting radiation having a first peak emission wavelength;
the luminescent material comprises a phosphor which emits radiation having a second peak wavelength in response to incident radiation source radiation; and
the radiation scattering particles are located in a carrier medium comprising a transmissive body and the radiation scattering particles comprise at least two layers of $TiO_2$ particles in about a 1 micron to about a 2 micron thick silica layer arranged to achieve photonic crystal effects.

16. The device of claim 1, wherein the radiation scattering particles scatter at least 50% more radiation source radiation than luminescent material radiation.

17. The device of claim 1, wherein the radiation scattering material does not luminesce and the luminescent material does not substantially scatter light or UV radiation.

18. The device of claim 17, wherein the luminescent material comprises a nanocrystalline phosphor.

19. A white light emitting device, comprising:
a package containing a reflector cup;
a light emitting diode in the reflector cup;
radiation scattering particles in a packed layer over the light emitting diode; and
a phosphor or an organic dye which emits radiation having a second peak wavelength in response to incident light emitting diode radiation having a first peak wavelength, such that the device output appears white to an observer;
wherein the phosphor or organic dye is located over and separately from the radiation scattering particles located in the packed layer and the phosphor or organic dye comprises a layer which does not contain radiation scattering particles.

20. The device of claim 19, wherein:
the light emitting diode comprises a blue or an ultraviolet light emitting diode;
the radiation scattering particles comprise light or UV radiation scattering particles in a carrier medium; and
the phosphor or the organic dye comprises a yellow or white light emitting phosphor layer or a dispersion of a phosphor in an epoxy or silicone.

21. The device of claim 20, wherein:
the light emitting diode comprises a light emitting diode having an emission wavelength of 365 to 420 nm; and
the phosphor or the organic dye comprises:
i) a white light emitting phosphor layer comprising one or more phosphors; or
ii) a dispersion of at least one phosphor and an epoxy or silicone.

22. The device of claim 20 wherein the light emitting diode comprises a blue emitting InGaN light emitting diode and the phosphor or the organic dye comprises a dispersion of an epoxy or silicone and a YAG:Ce$^{3+}$ phosphor.

23. A white light emitting device, comprising:
a package containing a reflector cup;
a light emitting diode in the reflector cup;
radiation scattering particles in a carrier medium over the light emitting diode; and
a phosphor which emits radiation having a second peak wavelength in response to incident light emitting diode radiation having a first peak wavelength, such that the device output appears white to an observer;
wherein:
the phosphor is located over and separately from the radiation scattering particles located in the carrier medium;
the light emitting diode comprises a blue or an ultraviolet light emitting diode;
the radiation scattering particles comprise light or UV radiation scattering particles in the carrier medium;
the phosphor comprises a yellow or white light emitting phosphor layer or a dispersion of a phosphor in an epoxy or silicone;
the radiation scattering particles are selected from a group consisting of $TiO_2$, $BaTiO_3$, $Al_2O_3$, $SiO_2$, $CaCO_3$, $BaSO_4$ and diamond particles having a mean diameter of 50 to 500 nm; and
the carrier medium is selected from glass, epoxy, silicone and urea resin.

24. The device of claim 23, wherein the light scattering particles in a carrier medium comprise at least one of the following:
a) light or UV radiation scattering particles in a glass passivation layer over the light emitting diode; and
b) light or UV radiation scattering particles in a silicone layer over the light emitting diode or over and on sides of the light emitting diode.

25. The device of claim 24, wherein the light scattering particles in a carrier medium comprise both a), b) and
c) a light or UV radiation scattering layer on sidewalls of the reflector cup.

26. The device of claim 25, wherein the particles in the glass passivation layer comprise 120 to 200 nm $TiO_2$ particles in a silica glass layer.

27. The device of claim 25, wherein the particles in the silicone layer comprise a silicone layer containing 5–10% of 120 to 200 nm amorphous silica particles in contact with the top and the sides of the light emitting diode.

28. The device of claim 25, wherein the light or UV radiation scattering layer on the sidewalls of the reflector cup comprises a $MgF_2$ layer or a polymer layer.

29. A white light emitting device, comprising:
a package containing a reflector cup;
a light emitting diode in the reflector cup;
radiation scattering particles in a carrier medium over the light emitting diode; and
a phosphor which emits radiation having a second peak wavelength in response to incident light emitting diode radiation having a first peak wavelength, such that the device output appears white to an observer;
wherein:
the phosphor is located over and separately from the radiation scattering particles located in the carrier medium;
the light emitting diode comprises a blue or an ultraviolet light emitting diode;
the radiation scattering particles comprise light or UV radiation scattering particles in the carrier medium;
the phosphor comprises a yellow or white light emitting phosphor layer or a dispersion of a phosphor in an epoxy or silicone;
a mean diameter of the radiation scattering particles is between $\lambda/3$ and $\lambda/2$, where $\lambda$ is the peak emission wavelength of the radiation source; and
the radiation scattering particles scatter at least 50% more radiation source radiation than luminescent material radiation.

30. A method of generating white light from a light emitting device, comprising a light emitting diode, a phosphor luminescent material and a radiation scattering material located between the light emitting diode and the luminescent material, wherein the radiation scattering material comprises radiation scattering particles located separately from the luminescent material, and a mean diameter of the radiation scattering particles is between $\lambda/3$ and $\lambda/2$, where k is a first peak emission wavelength of the radiation source;
the method comprising:
supplying power to the light emitting diode;
generating a directional radiation comprising blue light or ultraviolet radiation having the first peak emission wavelength;
passing the directional radiation through the radiation scattering material to diffuse the directional radiation in a plurality of directions;
providing the diffuse radiation comprising blue light or ultraviolet radiation onto the luminescent material; and
generating white light by emitting radiation having a second peak wavelength from the luminescent material.

31. The method of claim 30, wherein:
the first step of generating comprises generating blue light;
the step of passing comprises passing the blue light through light scattering particles;
the step of providing comprises providing the diffuse blue light onto the luminescent material which comprises a yellow light emitting phosphor; and
the second step of generating comprises providing a mix of the yellow light from the phosphor and the blue light from the light emitting diode that is transmitted through the phosphor.

32. The method of claim 30, wherein:
the first step of generating comprises generating radiation having a wavelength between 365 and 420 nm;
the step of passing comprises passing the radiation through radiation scattering particles;
the step of providing comprises providing the diffuse radiation onto the luminescent material which comprises at least one white light emitting phosphor; and
the second step of generating comprises generating white light from the at least one phosphor.

33. The method of claim 32, wherein the radiation comprises ultraviolet radiation.

34. A light emitting device, comprising:
a radiation source;
a luminescent material layer which does not substantially exhibit Mie scattering; and
a radiation scattering phosphor layer, which exhibits Mie scattering of the radiation source radiation, located between the radiation source and the luminescent material.

35. The device of claim 34, wherein:
the radiation source comprises a blue light emitting diode;
the luminescent material layer comprises a discrete yellow light emitting phosphor layer having a first a mean particle diameter; and
the radiation scattering phosphor layer comprises a discrete yellow emitting phosphor layer having a second mean particle diameter smaller than the first mean particle diameter.

36. The device of claim 35, wherein the luminescent material comprises YAG:Ce$^{3+}$ having a mean particle diameter between 1 to 10 microns and the radiation scattering phosphor comprises YAG:Ce$^{3+}$ having a mean particle diameter between 120 and 200 nm.

37. The light emitting device of claim 1, wherein the luminescent material is located separately from the radiation scattering particles.

38. The light emitting device of claim 19, wherein the radiation scattering particles in the packed layer are located separately from the phosphor or organic dye.

39. The light emitting device of claim 34, wherein the radiation source comprises a light emitting diode.

* * * * *